United States Patent [19]
Katoh et al.

[11] Patent Number: 5,730,924
[45] Date of Patent: Mar. 24, 1998

[54] MICROMACHINING OF POLYTETRAFLUOROETHYLENE USING RADIATION

[75] Inventors: Takanori Katoh, Niza; Yanping Zhang, Tanashi; Shiro Hamada, Hiratsuka, all of Japan

[73] Assignee: Sumitomo Heavy Industries, Ltd., Tokyo, Japan

[21] Appl. No.: 578,960

[22] Filed: Dec. 27, 1995

[30] Foreign Application Priority Data

Dec. 28, 1994 [JP] Japan ..................... 6-327545
Jun. 13, 1995 [JP] Japan ..................... 7-146127

[51] Int. Cl.⁶ ..................... C08J 7/00; B29C 71/04
[52] U.S. Cl. ............. 264/488; 264/400; 425/174.4; 378/68; 378/69
[58] Field of Search ............. 219/121.6, 121.65, 219/121.66, 121.67, 121.68, 121.69, 121.82; 264/400, 482, 473, 488; 156/643; 425/174.14; 378/64, 68, 69

[56] References Cited

U.S. PATENT DOCUMENTS

| | | | |
|---|---|---|---|
| 5,053,171 | 10/1991 | Portney et al. | 264/1.37 |
| 5,260,175 | 11/1993 | Kowanz et al. | |
| 5,302,421 | 4/1994 | Hoessel et al. | |
| 5,320,789 | 6/1994 | Nishii et al. | 264/122 |
| 5,378,137 | 1/1995 | Asakawa et al. | 264/400 |
| 5,415,977 | 5/1995 | Wuensch et al. | |
| 5,501,827 | 3/1996 | Deeney et al. | 264/482 |
| 5,555,549 | 9/1996 | Nakaishi. | |

FOREIGN PATENT DOCUMENTS 3-269024 11/1991 Japan ..................... 264/482

OTHER PUBLICATIONS

Article entitled "Ablation of Polytetrafluorethylene (Teflon) With Femtosecond UV Excimer Laser Pulses" by S. Kuper and M. Stuke, Appl. Phys. Lett. (54(1), Jan. 2, 1989, pp. 4–6.
Article entitled "Direct Photoetching of Polymer Films Using Vaccum Ultraviolet Radiation Generated by High-Order Anti-Stokes Raman Scattering", by Satoshi Wada, et al, Appl. Phys. Lett. 62(3), Jan. 18, 1993, pp. 211–213.
Lamda Highlights No. 25, a Publication by Lamda Physic, Oct., 1990, pp. 1 and 2.

*Primary Examiner*—Mathieu D. Vargot
*Attorney, Agent, or Firm*—Frishauf, Holtz, Goodman, Langer & Chick

[57] ABSTRACT

A method of micromachining polytetrafluoroethylene by applying radiation light to the surface of polytetrafluoroethylene, includes the steps of: preparing a workpiece including a region made of polytetrafluoroethylene; preparing a mask having patterned areas substantially transmitting and not transmitting the radiation light; and applying the radiation light containing at least ultraviolet rays of a wavelength of 160 nm to a surface of the workpiece through the mask. Polytetrafluoroethylene can be microscopically processed, while obtaining a high aspect ratio and processing a large area with ease.

25 Claims, 7 Drawing Sheets

POLYTETRAFLUOROETHYLENE
ABSORPTION COEFFICIENT

MICROMACHINING OF POLYTETRAFLUOROETHYLENE USING RADIATION

BACKGROUND OF THE INVENTION a) Field of the Invention

The present invention relates to micromachining of Polytetrafluoroethylene (PTFE).

PTFE may be one of the most suitable materials in making microparts for bioscience and medical applications, which is based on the facts that it is thermostable and chemicals-resistant and that its surface has very low adhesion as well as very low frictional-resistance. Thus, micromachining PTFE has been long desired.

b) Description of the Related Art

A known technology for micromachining called LIGA cannot be used for PTFE, since there is no solvent to dissolve PTFE and heating over the melting point does not result in enough fluidity to mould the micropart. Another method using electric discharge cannot be used either, since PTFE is a dielectric polymer.

Laser ablation is the only method for micromachining of PTFE, known from Küper et al., Appl. Phys. Lett. 54 (1989)4 and Wada et al., Appl. Phys. Lett., 62 (1993)211, using either vacuum ultraviolet lasers whose wavelengths were 160 nm or 157 nm or ultrashort lasers.

In the case of the laser ablation, the laser beam had to be strongly focussed by a converging optical system. Consequently, the ablation depth would be limited by focus depth so that the high aspect ratio (i.e., ratio of depth to minimum structure width) could hardly be obtained. Furthermore, spatial inhomogeneity and strong coherence of the laser beam resulted in unevenness of the ablated surface. The large area processing was difficult with a focussed laser beam.

SUMMARY OF THE INVENTION

It is an object of the present invention to provide a technique of micromachining of polytetrafluoroethylene capable of obtaining a high aspect ratio and processing a large area with ease.

According to one aspect of the present invention, there is provided a method of micromachining polytetrafluoroethylene by applying radiation light to the surface of polytetrafluoroethylene, comprising the steps of: preparing a workpiece including a region made of polytetrafluoroethylene; preparing a mask having patterned areas substantially transmitting and not transmitting the radiation light; and applying the radiation light containing at least ultraviolet rays of a wavelength of 160 nm to a surface of the workpiece through the mask.

Single photon absorption of polytetrafluoroethylene has a sharp peak near a wavelength of 160 nm. Ablation is therefore easy to be made if radiation light containing ultraviolet rays of a wavelength of 160 nm is applied to polytetrafluoroethylene. It is therefore possible to microscopically process polytetrafluoroethylene in conformity with a pattern formed on a mask, by applying such radiation light to polytetrafluoroethylene.

Prior to applying radiation light to the surface of a workpiece, the surface of the workpiece may be heated.

By heating polytetrafluoroethylene prior to applying radiation light, micromachining can be performed more precisely at a smaller photon density of radiation light as compared to the case where polytetrafluoroethylene is not heated.

According to another aspect of the present invention, there is provided a processing apparatus comprising: a light source for emitting radiation light containing at least ultraviolet rays having a wavelength of 160 nm; means for holding a workpiece including a region made of polytetrafluoroethylene on an optic axis of the radiation light emitted from the light source, the holding means being adapted to heat the workpiece; and means for carrying a mask having patterned areas substantially transmitting and not transmitting the radiation light and disposing the mask on the optic axis between the light source and the workpiece.

It is possible to apply radiation light containing ultraviolet rays having a wavelength of 160 nm to the surface of a workpiece secured by and heated with the holding means.

According to a further aspect of the present invention, there is provided a polytetrafluoroethylene device having a polytetrafluoroethylene region formed with a microscopically processed area, the microscopically processed area having a pattern on a top surface, the pattern having a minimum width of 20 to 50 µm, a depth or height of the microscopically processed area in a normal direction to the top surface being 50 µm or larger, and a shape and size of a cross section parallel to the top surface of the microscopically processed area being generally equal irrespective of a depth or height position in the normal direction to the top surface.

By applying radiation light containing ultraviolet rays having a wavelength of about 160 nm to polytetrafluoroethylene, a fine pattern with a minimum width of 20 to 50 µm and a depth of 50 µm or deeper can be formed without using a converging optical system. Since a converging optical system is not used, radiation light near the processed area can be considered to be generally parallel light. Therefore, the shapes and sizes of an opening and a bottom of a processed concave or a top surface and a bottom cross section of a formed convex become generally equal.

As above, it is possible to microscopically process polytetrafluoroethylene. Furthermore, a large area can be processed and a concave or convex having a large aspect ratio can be formed. It is possible to manufacture microparts for bioscience and medical applications by micromachining polytetrafluoroethylene.

DETAILED DESCRIPTION OF THE PREFERRED EMBODIMENTS

Figure 1A:
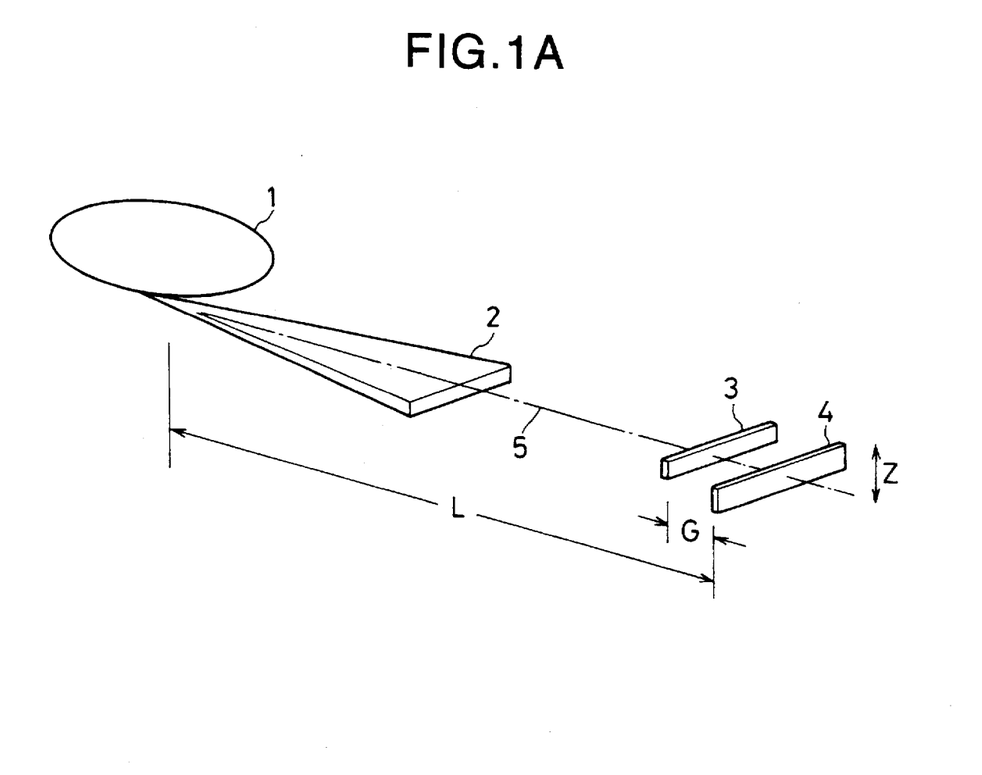
FIG. 1A is a perspective view showing the relative positions of a radiation light beam, a mask, and a workpiece of polytetrafluoroethylene to be processed according to an embodiment of the invention.

FIG. 1A is a perspective view showing the relative positions of a radiation light beam, a mask, and a workpiece of polytetrafluoroethylene to be processed according to an embodiment of the invention. Synchrotron radiation light (SR light) from the electronic orbit 1 emits along the optic axis 5. A workpiece 4 of polytetrafluoroethylene is placed at the position spaced apart from the light source by a distance L along the optic axis 5. A mask 3 is disposed in front of the workpiece 4 at a distance G from the workpiece 4. The electron orbit 1, workpiece 4, and mask 3 are housed in a single vacuum chamber.

Areas substantially transmitting and not transmitting SR light are defined of the masking surface of the mask 3. The mask 3 used in this embodiment is made of a copper plate of 10 to 500 μm thick. Patterns of a desired micro component are formed on the masking surface. Other metals may be used instead of copper.

The SR light beam 2 is applied via the mask 3 to the surface of the workpiece 4. The SR light beam 2 causes ablation on the surface of the workpiece 4, and the area applied with the SR light beam is removed. If ultra fine patterns are formed on the mask 3, the surface of the workpiece can be processed microscopically.

Figure 1B:
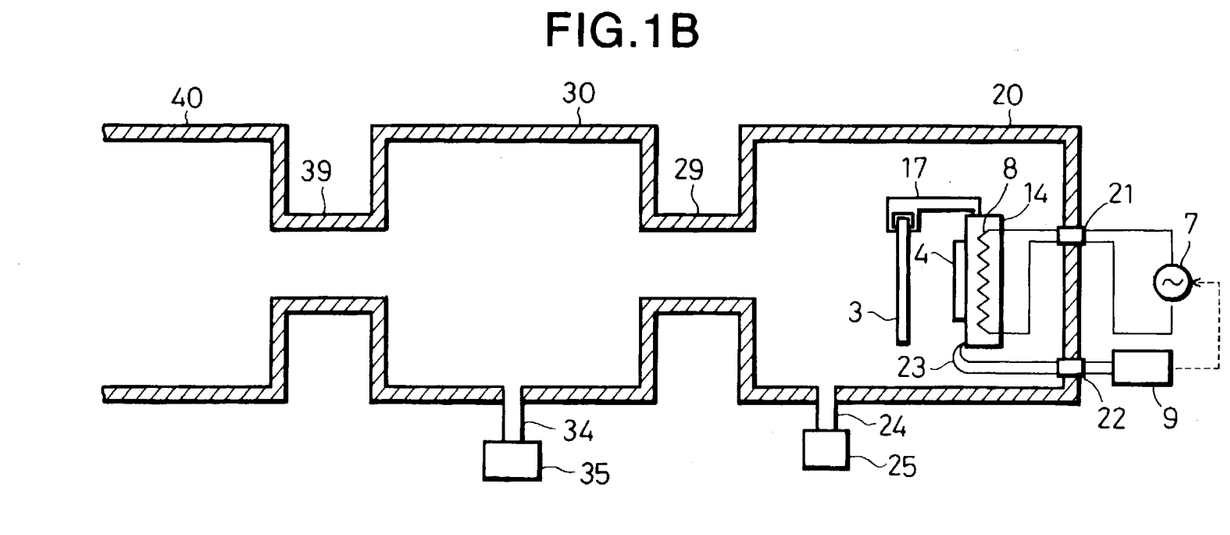
FIGS. 1B and 1C are cross sectional views of processing units of a polytetrafluoroethylene processing system.

FIG. 1B is a cross sectional view of the processing unit of a polytetrafluoroethylene processing system. A vacuum chamber 40 storing electronic orbit and a vacuum chamber 20 in which a workpiece 4 is disposed are connected via an orifice 39, vacuum chamber 30 and an orifice 29. A gas exhaust pipe 24 coupled to the vacuum chamber 20 is connected to a vacuum pump 25 so that the inside of the vacuum chamber 20 can be evacuated by the vacuum pump 25. Similarly, the inside of the vacuum chamber 30 can be evacuated by a vacuum pump 35 through an exhaust pipe 34. The orifices 39 and 29 work as fluid resistance so as to prevent gas generated in the vacuum chamber 20 during processing from entering the vacuum chamber 40.

A workpiece holder 14 is disposed in vacuum chamber 20. A workpiece 4 is secured on a workpiece holding surface of the workpiece holder 14. A mask 3 is held by a mask holder 17 and disposed in front of the workpiece 4 parallel to the workpiece surface. In processing the workpiece, the SR light beam 2 is irradiated from the left side of FIG. 1B to the surface of the workpiece 4 through the mask 3.

The workpiece holder 14 is made of, for example, ceramic and has an embedded heater 8. Lead wires of the heater 8 are connected to inner terminals of a connector 21 mounted on the wall of the vacuum chamber 20. Outer terminals electrically connected to the inner terminals of the connector 21 are connected to a power source 7 which supplies current to the heater 8 to heat the workpiece 4.

A thermocouple 23 is mounted on the workpiece holding surface of the workpiece holder 14. Lead wires of the thermocouple 23 extend out of the vacuum chamber 20 via a lead outlet port 22, and are connected to a temperature controller 9. The lead outlet port 22 is hermetically sealed by, for example, soldering. The temperature controller 9 controls the power source 7 and regulates current flowing to the heater 8 so as to maintain the workpiece holding surface at a desired temperature.

Figure 1C:
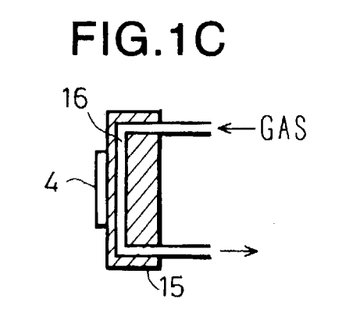

FIG. 1C shows an example of another structure of the workpiece holder. A gas flow path 16 is formed in the workpiece holder 15. Heat exchange between the workpiece and gas of a desired temperature flowing through the gas flow path 16 maintains the workpiece at a desired temperature.

Next, the wavelength of radiation light suitable for processing polytetrafluoroethylene will be discussed.

Figure 2A:
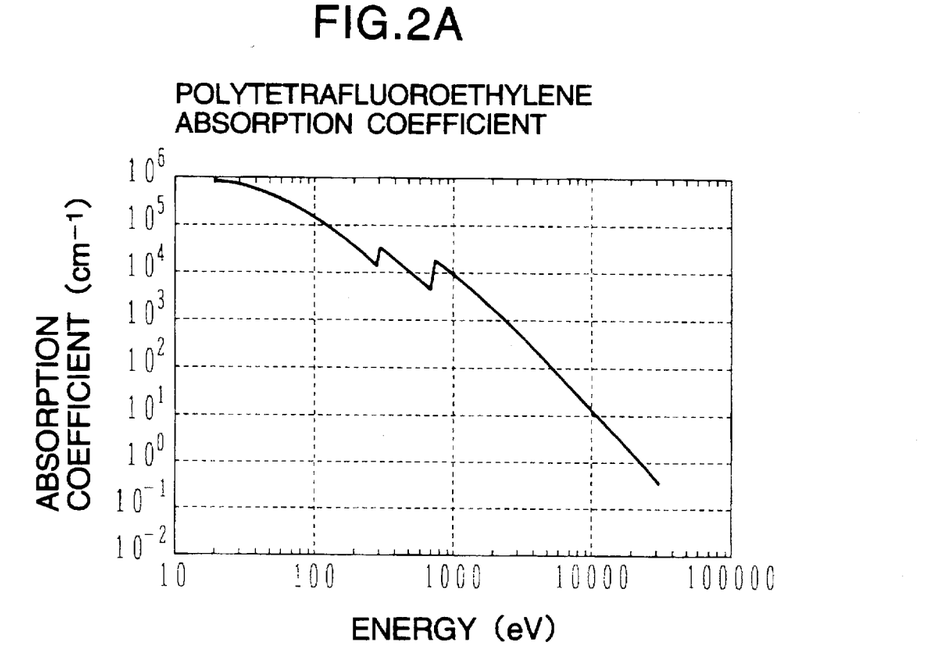
FIGS. 2A and 2B are graphs showing light absorption spectra of polytetrafluoroethylene relative to the energy of radiation light.

FIGS. 2A and 2B show light absorption spectra of polytetrafluoroethylene. In FIG. 2A, the abscissa represents photon energy in the unit of eV, and the ordinate represents an absorption coefficient in the unit of $cm^{-1}$. As shown in FIG. 2A, as the energy of radiation light increases, absorption tends to reduce. Furthermore, the absorption coefficient at $10^4$ eV (wavelength of about 0.1 nm) is about a $10_{-4}$-fold of that at $10^2$ eV and very small. Therefore, radiation light having a wavelength of 0.1 nm or smaller is almost ineffective for micromachining polytetrafluoroethylene.

Figure 2B:
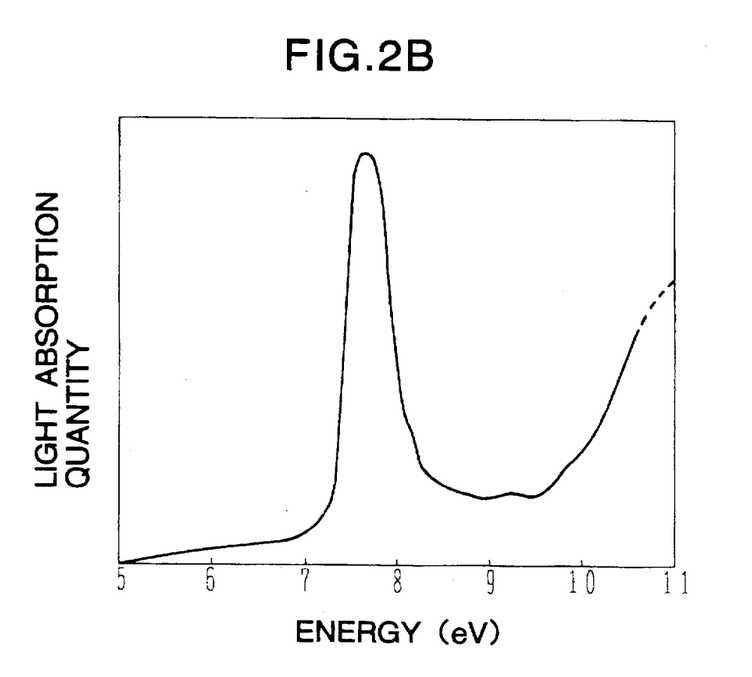

In FIG. 2B, the abscissa represents photon energy in the unit of eV, and the ordinate represents light absorption quantity in an arbitrary unit. As shown in FIG. 2B, absorption in the vacuum ultraviolet range has a large peak near the energy of 7.7 eV (wavelength of 160 nm). It is therefore preferable that radiation light to be used for processing polytetrafluoroethylene contains ultraviolet rays having a wavelength of 160 nm.

Next, the experiment result of micromachining of polytetrafluoroethylene by the processing system shown in FIGS. 1A to 1B will be described. SR light having a successive wavelength distribution from the infrared region to the X-ray region was used for processing a sheet of polytetrafluoroethylene having a thickness of 1.5 mm. The distance L between the workpiece 4 and the light source was set to 3 m.

The polytetrafluoroethylene sheet whose surface was polished and cleaned with methanol, and secured to the workpiece holder. The mask 3 with fine patterns being formed was disposed in front of the workpiece 4 spaced about 0.5 mm.

After the mask 3 and workpiece 4 were set in the above manner, the inside of the vacuum chamber was evacuated to $7\times10^{-7}$ Pa. SR light was applied to the workpiece 4. The intensity of SR light was set so that the photon flux at the surface of the workpiece was $3\times10^{15}$ photons/sec.mm². The SR source used was a compact superconducting electron storage ring. Its synchrotron radiation had a continuous spectrum from infrared to X-ray with the critical wavelength of 1.5 nm. Actually, the spectrum used is mainly between 0.1 to 180 nm.

Figure 3A:
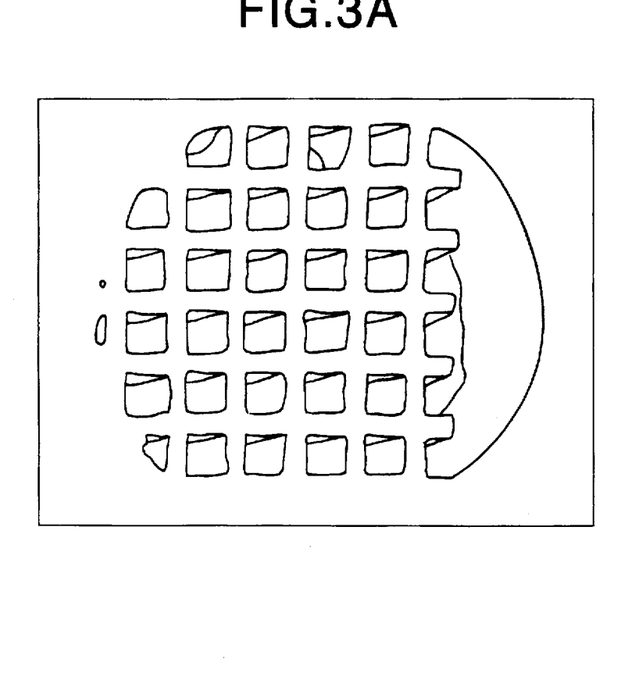
FIGS. 3A and 3B are diagrams sketched from photographs showing enlarged views of microstructures made in the polytetrafluoroethylene workpiece by the embodiment method.
Figure 3B:
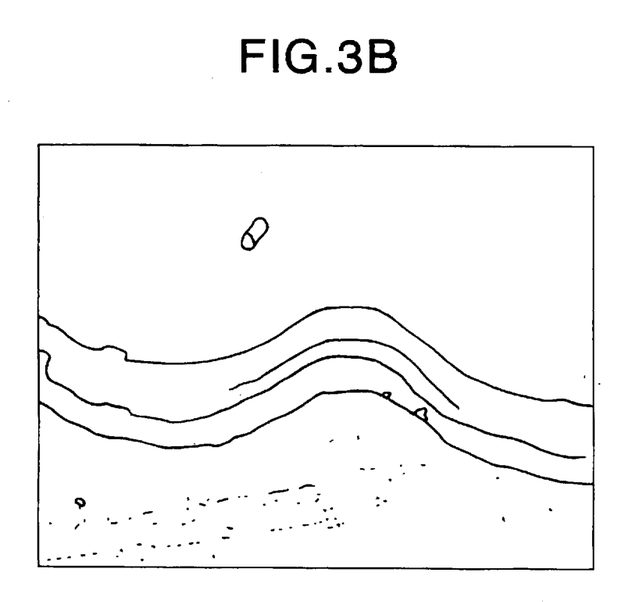

FIGS. 3A and 3B are sketches of photographs showing processed areas of the polytetrafluoroethylene sheet processed under the above conditions. FIG. 3A is a sketch of a photograph of a processed component having a pattern minimum width of 20 μm and a depth of 220 μm, the component being viewed obliquely from the upper side. As seen from FIG. 3A, processed side walls were smooth. FIG. 3B is a sketch of a photograph showing a concave of 100 μm deep, as viewed from the upper side. The lower half of FIG. 3B shows the surface of the polytetrafluoroethylene sheet, and the upper half shows the bottom of the concave. As shown in FIG. 3B, the concave having a smooth bottom surface was able to be formed.

As above, a smooth processed surface can be obtained by setting the photon density to $3\times10^{15}$ photons/sec.mm². The higher the photon density becomes, the higher the processing speed and the smoother the surface becomes.

It can be considered that SR light is generally parallel near the processed area. Therefore, the side wall of the concave is generally perpendicular to the surface of polytetrafluoroethylene. The shape and size of the bottom of a concave are therefore almost the same as those of the top opening of the concave. If the pattern areas transmitting and not transmitting SR light of the mask are interchanged, a convex can be formed. Also in this case, the shape and size of the cross section of the bottom of the convex are almost the same as those of the top surface of the convex.

Although the processed area of the pattern minimum width of 20 μm and the depth of 220 μm is shown in FIG. 3A, other fine patterns having a pattern minimum width of 20 to 50 μm and a depth of 220 μm or deeper may be formed.

Figure 4:
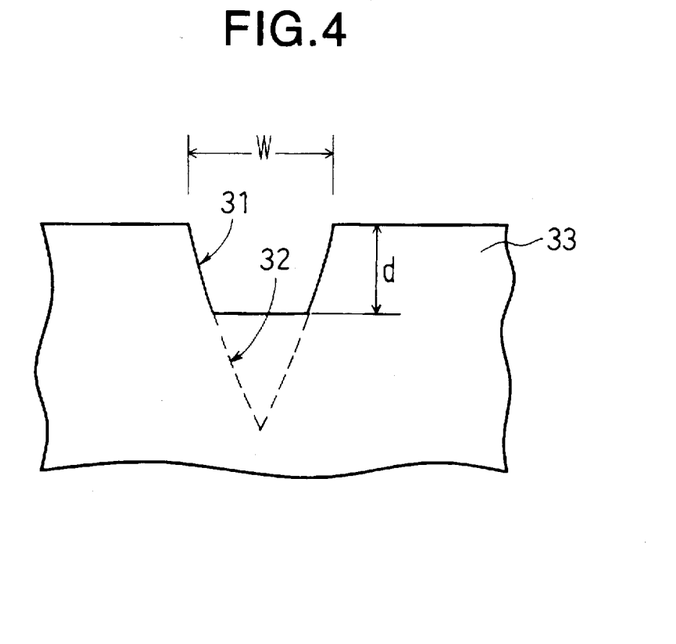
FIG. 4 is a cross sectional view of the processed area illustrating the definition of an aspect ratio.

The definition of the aspect ratio will be described with reference to FIG. 4. A concave 31 is being formed in a workpiece 33. The width of the concave 31 becomes narrower at a deeper position. This shape corresponds to the side of a laser beam converged by an optical system. The aspect ratio is defined by d/w where d is a depth of the concave and w is a width at the opening. If a workpiece is processed by a laser beam, as the depth d increases, the width w increases correspondingly because the side wall of the concave 31 is slanted. It is therefore difficult to form a concave having a high aspect ratio. In contrast with this, if a workpiece is processed by SR light, the side wall of the concave 31 is generally vertical so that the width w hardly increases even if the depth d is increased. It is therefore easy to obtain a high aspect ratio.

Since a converging optical system is not used in the above embodiment, SR light can be approximated to generally parallel light if a proper distance is ensured between a point light source and the surface of a workpiece. Therefore, as shown in FIG. 3A, the side wall of the concave can be processed generally vertically. It is therefore easy to form a concave having an aspect ratio of 1 or higher. This embodiment is particularly effective for microscopically processing a workpiece having a pattern minimum width of 20 to 50 μm, a depth of 50 μm or deeper, and an aspect ratio of 10 or higher.

Figure 5:
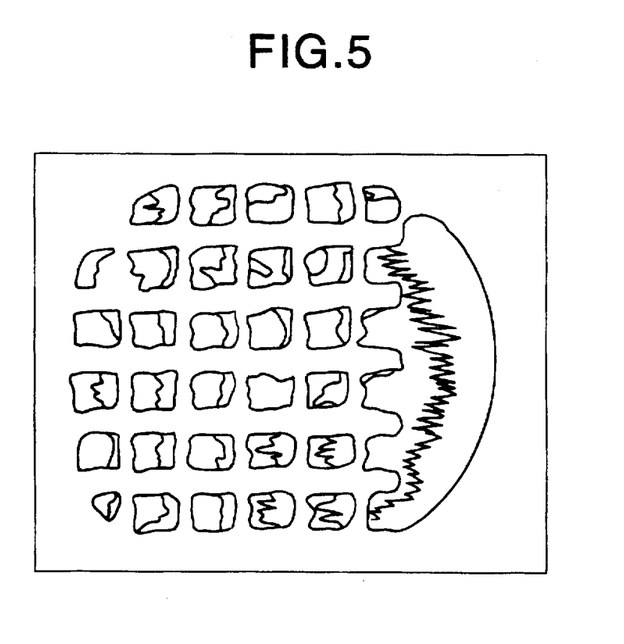
FIG. 5 is a diagram sketched from a photograph showing an enlarged view of microstructure made in the polytetrafluoroethylene workpiece under a lower photon density.

FIG. 5 is a sketch of a photograph showing an area processed under the same conditions as used for the workpiece shown in FIG. 3A, excepting a photon density of SR light being set smaller. As shown in FIG. 5, a number of irregular areas are formed on the side walls of concaves. It can be considered from this that it is preferable to set a photon density at the processed area to $3 \times 10^{15}$ photons/sec.mm$^2$ or higher in order to form a concave having a smooth side wall.

In the above embodiment, radiation light is applied to a polytetrafluoroethylene sheet while maintaining the sheet at a room temperature. A polytetrafluoroethylene sheet may be heated before radiation light is applied. In the following, a method of processing a polytetrafluoroethylene sheet while heating it will be described.

As shown in FIG. 1A, after the mask 3 and workpiece 4 are set, the inside of the vacuum chamber 20 shown in FIG. 1B is evacuated to $7 \times 10^{-7}$ Pa. Thereafter, a polytetrafluoroethylene is heated and maintained at a temperature of 200° C. SR light is applied to the polytetrafluoroethylene sheet workpiece 4. The intensity of SR light is set so that the photon density at the surface of the workpiece is $1.5 \times 10^{15}$ photons/sec.mm$^2$. The radiation time is 10 minutes.

Figure 6A:
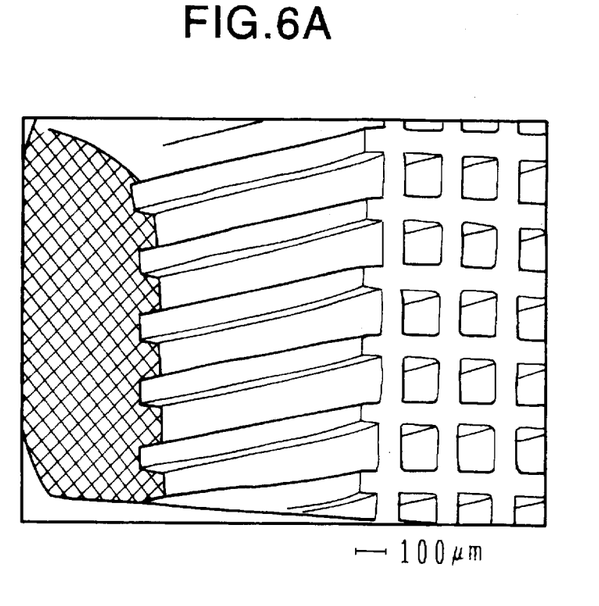
FIGS. 6A and 6B are diagrams sketched from photographs showing enlarged views of microstructures made in the polytetrafluoroethylene workpiece heated and processed by the embodiment method.
Figure 6B:
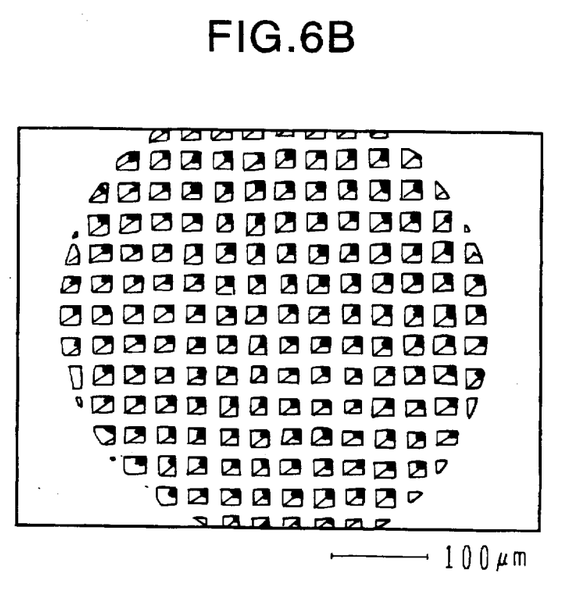

FIGS. 6A and 6B are sketches of photographs showing processed areas of the polytetrafluoroethylene sheet processed under the above conditions.

FIG. 6A shows the polytetrafluoroethylene sheet with through holes formed by using a lattice pattern mask having the minimum line width of about 100 μm. The side wall of each through hole is generally vertical to the surface of the polytetrafluoroethylene sheet, and the line width of a polytetrafluoroethylene area left in a lattice shape is generally constant in the thickness direction. In this case, a ratio (aspect ratio) of the thickness of the polytetrafluoroethylene sheet to the minimum line width at the surface of the polytetrafluoroethylene sheet is about 15.

FIG. 6B shows the polytetrafluoroethylene sheet microscopically processed by using a lattice pattern mask having the minimum line width of about 10 μm. It is seen from this sketch that good processing is possible even at the minimum line width of 10 μm. As above, micromachining at a line width of 100 μm or narrower becomes possible by applying SR light to the surface of polytetrafluoroethylene under the above conditions.

As described with FIGS. 3A and 3B, if SR light is applied without heating a polytetrafluoroethylene sheet, it is necessary to set the photon density at the surface of the polytetrafluoroethylene sheet to $3 \times 10^{15}$ photons/sec.mm$^2$ in order to obtain a good side wall at the processed area. In contrast with this, if a polytetrafluoroethylene sheet is heated, a good side wall at the processed area can be formed by SR light at about a half of the above-described photon density.

In the above embodiment, although the photon density at the surface of a workpiece is set to $1.5 \times 10^{15}$ photons/sec.mm$^2$ at the wavelength range from 0.1 nm to 180 nm, SR light may be applied at different photon densities. In order to obtain a smooth processed surface, it is preferable to set the photon density at the surface of a workpiece to $1.5 \times 10^{15}$ photons/sec.mm$^2$ or higher at the wavelength range from 0.1 nm to 180 nm. The processing speed can be increased if the photon density is increased.

In the above embodiment, although the temperature of a polytetrafluoroethylene sheet is set to 200° C. prior to applying SR light, the temperature may be set to 50° C. to 250° C. More preferably, the temperature is set in the range from 150° C. to 220° C.

A polytetrafluoroethylene sheet was processed by the above method. It was possible to obtain generally the same processing precision as that of a resist mask patterned through X-ray lithography using the same mask.

In the above two embodiments, the distance G between the workpiece 4 and mask 3 is set to 0.5 mm. The distance G may be set differently. However, if the distance G is too large, diffraction of SR light makes an image of the surface of a workpiece unsharp and a fine pattern cannot be formed. On the other hand, if the distance G is too small, heat is likely to radiate from the processed area to the mask and stains generated during processing are likely to be attached to the mask. It can be considered from various experiment results that the distance G between the workpiece 4 and mask 3 is preferably set in the range from 0.3 to 0.5 mm.

As seen in FIG. 1A, a cross section of an SR light beam vertical to the optic axis has a shape longer in one direction (the horizontal direction) than in another direction (vertical direction). For example, in the case of the synchrotron used in the above-described embodiments, the beam size at the position remote from the light source by 3 m is about 3 mm in the vertical direction and about 30 mm in the horizontal direction. Therefore, an area relatively broad in the horizontal direction can be processed at the same time. If an area relatively broad in the vertical direction is to be processed, both the workpiece 4 and mask 3 are moved in the vertical direction (Z-axis direction shown in FIG. 1A) at the same time.

Figure 7:
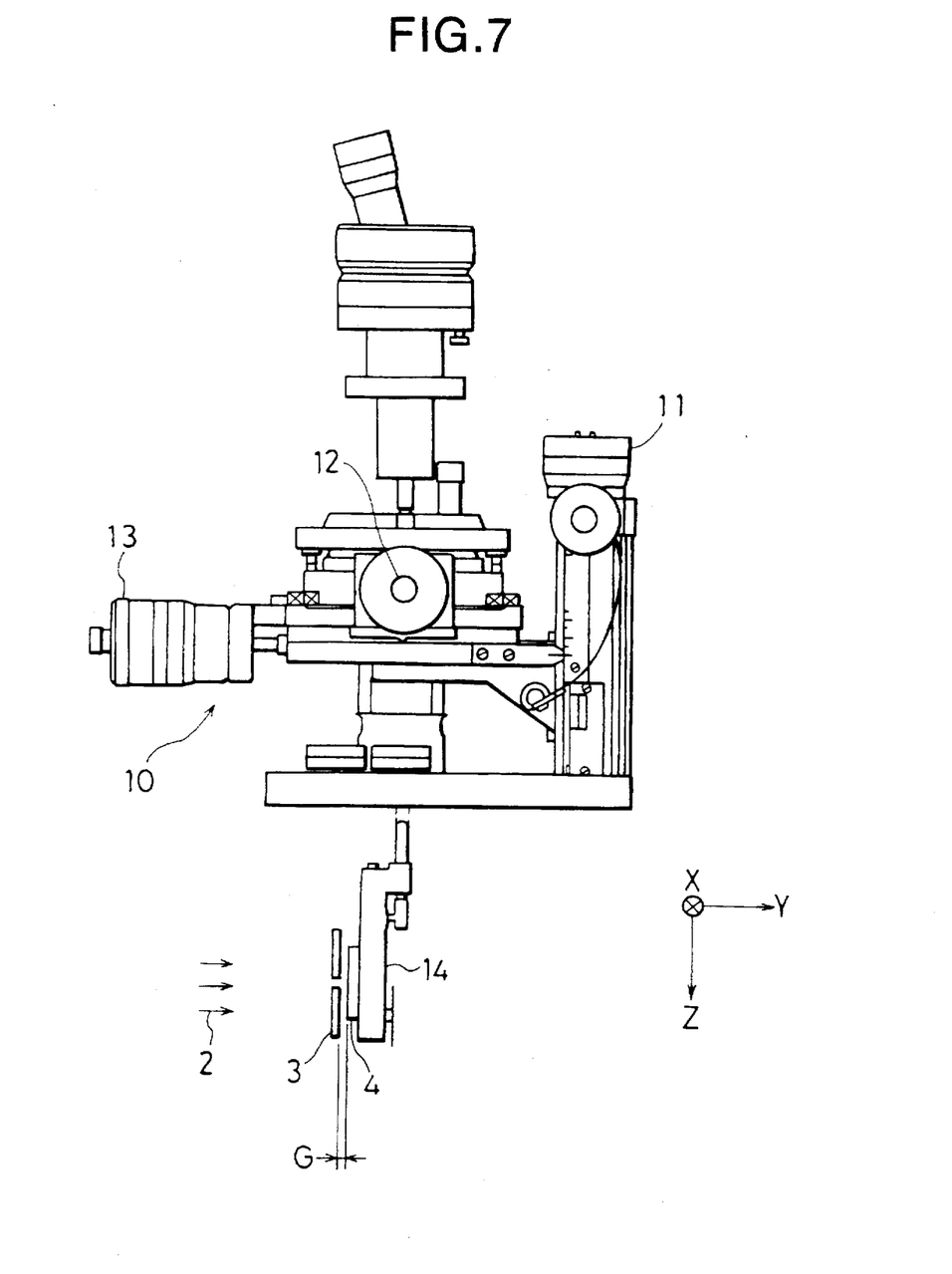
FIG. 7 is a side view of a drive mechanism for moving a workpiece.

FIG. 7 is a schematic diagram showing a drive mechanism for driving the workpiece 4 and mask 3 in the Z-axis direction. A workpiece holder 14 is mounted on the drive mechanism 10, with its workpiece holding surface being set generally perpendicular to the optic axis (Y-axis direction) of SR light 2. A workpiece 4 is secured to the workpiece holding surface of the workpiece holder 14, and a mask 3 is set in front of the workpiece 4 spaced apart from the surface thereof by a distance G.

Handles 11, 12, and 13 are coupled to the drive mechanism 10. As the handle 11 is rotated, the workpiece holder 14 moves in an upward/downward direction (Z-axis direction). By rotating the handle 11 by using a stepping motor, the stage 14 can be moved in the Z-axis direction at a desired constant speed.

As the handles 12 and 13 are rotated, the workpiece holder 14 moves in the direction (X-axis direction) perpendicular to the drawing sheet and in the Y-axis direction, respectively. The positions of the workpiece holder 14 in the X- and Y-axis directions can be finely adjusted by the handles 12 and 13.

A relatively broad area can be easily processed by moving the workpiece 4 in the Z-axis direction by rotating the handle 11 with the stepping motor, while SR light 2 is applied. Good micromachining was possible by setting the motion speed in the Z-axis direction to $5 \times 10^{-2}$ mm/s at the photon density of $3 \times 10^{15}$ photons/sec.mm$^2$.

The present invention has been described in connection with the preferred embodiments. The invention is not limited only to the above embodiments. It is apparent to those skilled in the art that various modifications, improvements, combinations and the like can be made without departing from the scope of the appended claims.

We claim:

1. A method of micromachining polytetrafluoroethylene by applying synchrotron radiation light to the surface of polytetrafluoroethylene, the method comprising the steps of:
    preparing a workpiece including a region made of polytetrafluoroethylene;
    preparing a mask having patterned areas substantially transmitting the synchrotron radiation light and other areas substantially not transmitting the synchrotron radiation light;
    heating at least a surface of said region made of polytetrafluoroethylene using a heater attached to a workpiece holder prior to said synchrotron radiation light applying step; and
    ablating the polytetrafluoroethylene in an irradiated region thereof by a step of applying the synchrotron radiation light containing at least ultraviolet rays of a wavelength of about 160 nm to a surface of the polytetrafluoroethylene region of said workpiece through said mask such that the irradiated region is ablating during application of the synchrotron radiation light.

2. A method of micromachining polytetrafluoroethylene according to claim 1, wherein said synchrotron radiation light applying step comprises applying synchrotron radiation light having a photon flux of $3 \times 10^{15}$ photons/sec.mm$^2$ or higher at the polytetrafluoroethylene surface of said workpiece in a wavelength range from 0.1 nm to 180 nm.

3. A method of micromachining polytetrafluoroethylene according to claim 1, wherein said synchrotron radiation light applying step comprises applying the synchrotron radiation light while disposing said mask spaced apart from the polytetrafluoroethylene surface of said workpiece by 0.3 to 0.5 mm.

4. A method of micromachining polytetrafluoroethylene according to claim 2, wherein said synchrotron radiation light applying step comprises applying the synchrotron radiation light while disposing said mask spaced apart from the polytetrafluoroethylene surface of said workpiece by 0.3 to 0.5 mm.

5. A method of micromachining polytetrafluoroethylene according to claim 1, wherein:
    a cross section of the synchrotron radiation light in a plane perpendicular to an optic axis of the synchrotron radiation light has a shape which is longer in one direction than in another direction, and
    said synchrotron radiation light applying step comprises applying the synchrotron radiation light to said workpiece while moving said workpiece and said mask in a direction perpendicular to the optic axis of the synchrotron radiation light.

6. A method of micromachining polytetrafluoroethylene according to claim 2, wherein:
    a cross section of the synchrotron radiation light in a plane perpendicular to an optic axis of the synchrotron radiation light has a shape which is longer in one direction than in another direction, and
    said synchrotron radiation light applying step comprises applying the synchrotron radiation light to said workpiece while moving said workpiece and said mask in a direction perpendicular to the optic axis of the synchrotron radiation light.

7. A method of micromachining polytetrafluoroethylene according to claim 1, wherein said synchrotron radiation light applying step comprises applying synchrotron radiation light having a photon flux of $1.5 \times 10^{15}$ photons/sec.mm$^2$ or higher at the polytetrafluoroethylene surface of said workpiece in a wavelength range from 0.1 nm to 180 nm.

8. A method of micromachining polytetrafluoroethylene according to claim 1, wherein said synchrotron radiation light applying step comprises applying the synchrotron radiation light while disposing said mask spaced apart from the polytetrafluoroethylene surface of said workpiece by 0.3 to 0.5 mm.

9. A method of micromachining polytetrafluoroethylene according to claim 7, wherein said synchrotron radiation light applying step comprises applying the synchrotron radiation light while disposing said mask spaced apart from the polytetrafluoroethylene surface of said workpiece by 0.3 to 0.5 mm.

10. A method of micromachining polytetrafluoroethylene according to claim 9, wherein:
    a cross section of the synchrotron radiation light in a plane perpendicular to an optic axis of the synchrotron radiation light has a shape which is longer in one direction than in another direction, and
    said synchrotron radiation light applying step comprises applying the synchrotron radiation light to said workpiece while moving said workpiece and said mask in a direction perpendicular to the optic axis of the synchrotron radiation light.

11. A method of micromachining polytetrafluoroethylene according to claim 7, wherein:
    a cross section of the synchrotron radiation light in a plane perpendicular to an optic axis of the synchrotron radiation light has a shape which is longer in one direction than in another direction, and
    said synchrotron radiation light applying step comprises applying the synchrotron radiation light to said workpiece while moving said workpiece and said mask in a direction perpendicular to the optic axis of the synchrotron radiation light.

12. A method of micromachining polytetrafluoroethylene according to claim 1, wherein said heating step comprises heating a surface of said region made of polytetrafluoroethylene to 50° to 250° C.

13. A method of micromachining polytetrafluoroethylene according to claim 7, wherein said heating step comprises heating a surface of said region made of polytetrafluoroethylene to 50° to 250° C.

14. A method of micromachining polytetrafluoroethylene according to claim 12, wherein said heating step comprises heating said surface of said region made of polytetrafluoroethylene to 150° to 220° C.

15. A method of micromachining polytetrafluoroethylene according to claim 13, wherein said heating step comprises heating said surface of said region made of polytetrafluoroethylene to 150° to 220° C.

16. A micromachining apparatus for micromachining polytetrafluoroethylene, comprising:

a synchrotron light source for emitting synchrotron radiation light containing at least ultraviolet rays having a wavelength of about 160 nm, with a cross section of the synchrotron radiation light in a plane perpendicular to an optic axis of the synchrotron radiation light has a shape which is longer in one direction than in another direction;

a workpiece holder for holding a workpiece, the workpiece including a region made of polytetrafluoroethylene, said workpiece holder holding said workpiece on the optic axis of the synchrotron radiation light emitted from said light source, add said workpiece holder including a heater arranged to heat at least a surface portion of said polytetrafluoroethylene region of said workpiece;

a mask holder for carrying a mask having patterned areas substantially transmitting the synchrotron radiation light and other areas substantially not transmitting the synchrotron radiation light, and for disposing said mask on the optic axis at a position between said synchrotron light source and said workpiece such that the synchrotron radiation light is applied to a surface of said polytetrafluoroethylene region of said workpiece through said mask; and a drive mechanism for moving said workpiece and said mask in a direction perpendicular to the optic axis of the synchrotron radiation light, while maintaining a fixed relative position between said workpiece and said mask.

17. A micromachining apparatus for micromachining polytetrafluoroethylene, comprising:

a synchrotron light source for emitting synchrotron radiation light containing at least ultraviolet rays having a wavelength of about 160 nm;

a workpiece holder for holding a workpiece, the workpiece including a region made of polytetrafluoroethylene, said workpiece holder holding said workpiece on an optic axis of the synchrotron radiation light emitted from said light source, and said workpiece holder including a heater arranged to heat at least a surface portion of said polytetrafluoroethylene region of said workpiece; and a mask holder for carrying a mask having patterned areas substantially transmitting the synchrotron radiation light and other areas substantially not transmitting the synchrotron radiation light, and for disposing said mask on the optic axis at a position between said synchrotron light source and said workpiece such that the synchrotron radiation light is applied to a surface of said polytetrafluoroethylene region of said workpiece through said mask.

18. A micromachining apparatus according to claim 17, wherein the heater is an electrical heater.

19. A micromachining apparatus according to claim 17, wherein the heater is a gas flow heater.

20. A method of micromachining polytetrafluoroethylene according to claim 5, wherein said workpiece and said mask are moved with a fixed relative position with respect to each other.

21. A method of micromachining polytetrafluoroethylene according to claim 6, wherein said workpiece and said mask are moved with a fixed relative position with respect to each other.

22. A method of micromachining polytetrafluoroethylene according to claim 10, wherein said workpiece and said mask are moved with a fixed relative position with respect to each other.

23. A method of micromachining polytetrafluoroethylene according to claim 11, wherein said workpiece and said mask are moved with a fixed relative position with respect to each other.

24. A method of micromachining polytetrafluoroethylene according to claim 1, wherein said synchrotron radiation light applying step comprises applying synchrotron radiation light having a photon flux of $3 \times 10^{15}$ photons/sec.mm$^2$ or higher at the polytetrafluoroethylene surface of said workpiece.

25. A method of micromachining polytetrafluoroethylene according to claim 1, wherein said synchrotron radiation light applying step comprises applying synchrotron radiation light having a photon flux of $1.5 \times 10^{15}$ photons/sec.mm$^2$ or higher at the polytetrafluoroethylene surface of said workpiece in a wavelength of about 160 nm.

* * * * *